United States Patent [19]

Barnett et al.

[11] Patent Number: 4,477,688
[45] Date of Patent: Oct. 16, 1984

[54] PHOTOVOLTAIC CELLS EMPLOYING ZINC PHOSPHIDE

[75] Inventors: Allen M. Barnett, Newark; Anthony W. Catalano, Wilmington; Vikram L. Dalal, Newark, all of Del.; James V. Masi, Wilbraham, Mass.; John D. Meakin, Newark, Del.; Robert B. Hall, Newark, Del.

[73] Assignee: The University of Delaware, Newark, Del.

[21] Appl. No.: 944,971

[22] Filed: Sep. 22, 1978

[51] Int. Cl.³ ............................................. H01L 31/06
[52] U.S. Cl. .................................... 136/258; 136/255; 136/256; 136/260; 136/264; 136/265
[58] Field of Search .......... 136/89 SJ, 89 TF, 89 CU, 136/89 CD, 255, 258, 260, 265; 357/15, 16, 30, 61; 250/211 R, 211 J, 212

[56] References Cited

U.S. PATENT DOCUMENTS 3,368,125  2/1968  Pasierb ................................. 317/237

FOREIGN PATENT DOCUMENTS 50-153885  12/1975  Japan ..................................... 136/89

OTHER PUBLICATIONS

A. Catalano et al., "Zn3P2: A Promising Photovoltaic Material", Special Short Abstract, 13th IEEE Photovoltaic Specialists Conf., Wash. DC, Jun. 5–8, 1978.
A. Catalano et al., "Zn3P2: A Promising Photovoltaic Material", Conf. Record, 13th IEEE Photovoltaic Specialists Conf., (1978), pp. 288–293.
A. Catalano et al., "Crystal Growth & Electrical Properties of Zn3P2", Abstract No. 434, J. Electrochem. Soc., Aug. 1977, p. 318c.
Chem. Abstr., vol. 87, 191380c (1977).
Chem. Abstr., vol. 84, 182447r (1976).
V. I. Volodina et al., "Influence of Additional Laser Illumination on the Photoresponse Spectra of Au-Zn3P2 Schottky Diodes", Sov. Phys. Semicond., vol. 11, No. 3, Mar. 1977 (p. 264).
"Proceedings of the ERDA Semiannual Photovoltaic Advanced Materials Program Meeting", ERDA Pub. No. Conf. 770318, Sep. 1977, pp. 451–473.
A. Catalano et al., "Zn3P2, As a Photovoltaic Material", Proceedings Int'l. Photovoltaic Solar Energy Conf., Luxembourg, Sep. 27–30, 1977, Reidel Pub. Co. (1978), pp. 644–653.

Primary Examiner—Aaron Weisstuch
Attorney, Agent, or Firm—Connolly and Hutz

[57] ABSTRACT

A photovoltaic cell having a zinc phosphide absorber. The zinc phosphide can be a single or multiple crystal slice or a thin polycrystalline film. The cell can be a Schottky barrier, heterojunction or homojunction device. Methods for synthesizing and crystallizing zinc phosphide are disclosed as well as a method for forming thin films.

4 Claims, 8 Drawing Figures

PHOTOVOLTAIC CELLS EMPLOYING ZINC PHOSPHIDE

The United States Government has rights in this invention pursuant to Contract No. EX-76-C-01-2460 awarded by the United States Department of Energy.

TECHNICAL FIELD

This invention relates to photovoltaic cells and, in particular, to photovoltaic cell employing a zinc phosphide absorber generator.

BACKGROUND ART

A photovoltaic cell, often referred to as a solar cell, is a semiconductor junction device which converts light energy into electrical energy. A typical photovoltaic cell is a layered structure comprising four principal layers: (1) an absorber-generator, (2) a collector-converter, (3) a transparent electrical contact, and (4) an opaque electrical contact. When light is shone through transparent contact onto the absorber-generator, the device generates a voltage differential between the two contacts and a current which increases as the intensity of the light increases.

The absorber-generator (commonly referred to as the "absorber") is a layer of semiconductor material which absorbs photons and, as a consequence, generates minority carriers. Typically atoms of the absorber absorb photons and eject electrons thus creating pairs of negatively charged carriers (electrons) and positively charged carriers ("holes"). If the absorber is a p-type semiconductor, the electrons are minority carriers; if it is n-type, the holes are minority carriers. As minority carriers are readily annihilated in the absorber by recombination with the plentiful majority carriers, they must be transported to a region wherein they are majority carriers before they can be utilized to power an electrical circuit.

The collector-converter (the "collector") is a layer of material in electrical contact with the absorber wherein the majority carriers are ot the same conductivity type as the minority carriers generated in the absorber. This layer "collects" minority carriers from the absorber and "converts" them into minority carriers. If the collector is an oppositely doped region of the same semiconductor as the absorber, the photovoltaic device is a p-n junction or homojunction device. If the collector is comprised of a different semiconductor, the device is a heterojunction; and, if the collector is metal, the device is a Schottky junction.

The transparent contact is a conductive electrical contact which permits light to pass through to the absorber. It is typically either a continuous transparent sheet of conductive material or an open grid of opaque conductive material. If the transparent contact is on the same side of the photovoltaic device as the absorber, the device is referred to as being in the front wall configuration. If the transparent contact is on the opposite side, the device is said to be in the back wall configuration.

HISTORY OF THE ART

Although scientists have known about the photovoltaic effect for more than a century, it is only within the past twenty-five years that it could be considered a practical means for generating electricity is useful amounts. Prior to 1950, photovoltaic devices were limited in use to highly specialized applications, such as light metering, wherein conversion efficiency was immaterial and electrical current demand was minimal.

The advent of silicon junction technology in the 1950's permitted the development of high cost, high conversion efficiency silicon junction photovoltaic cells. Arrays of such devices have been used with considerable success in the space program, where cost is of little significance. However, the cost of such devices as energy generators, typically as high as $100,000 per kilowatt, is prohibitively high for terrestrial applications wherein they must compete against conventional generators. While much of this cost is due to the high quality control standards required for spacecraft components, a substantial portion is due to the high cost of preparing silicon crystals of the required purity and due to the inefficiencies of the batch processes by which such cells are fabricated.

While thin film photovoltaic cells possess many potential advantages over silicon cells in terrestrial applications, the fabrication and use of thin film cells has historically been plagued with problems of low yield, non-reproducibility and unreliability. Thin film photovoltaic cells employing thin films of polycrystalline material offer substantial advantages for the development of continuous processing techniques, and they are flexible and light of weight. Consequently, they offer much promise as cells which can be easily fabricated, transported and deployed over large areas. Unfortunately, thin film cells of good efficiency have been difficult to reproduced consistently, and the operating lifetime of the cells produced has been uncertain.

DISCLOSURE OF THE INVENTION

The present applicants have discovered that high efficiency photovoltaic cells, including thin film cells, can comprise photovoltaic junctions formed on single crystal or polycrtstalline zinc phosphide ($Zn_3P_2$) or mixed crystal zinc cadmium phosphide [$(Zn_xCd_{1-x})_3P_2 (0 \leq X \leq 1)$]. The cells can be of the Schottky barrier, heterojunction or homojunction type. These cells show excellent promise for use as solar cells because of the low cost of the constituent materials, their high energy conversion efficiency and the stability of their constituents. Schottky barrier devices with active area conversion efficiencies so high as 7.8 percent have been demonstrated.

BRIEF DESCRIPTION OF THE DRAWINGS

The nature, advantages, and various additional features of the invention will appear more fully upon consideration of the illustrative embodiments now to be described in detail in connection with the accompanying drawings.

In the drawings.

BEST MODE FOR CARRYING OUT THE INVENTION

Figure 2:
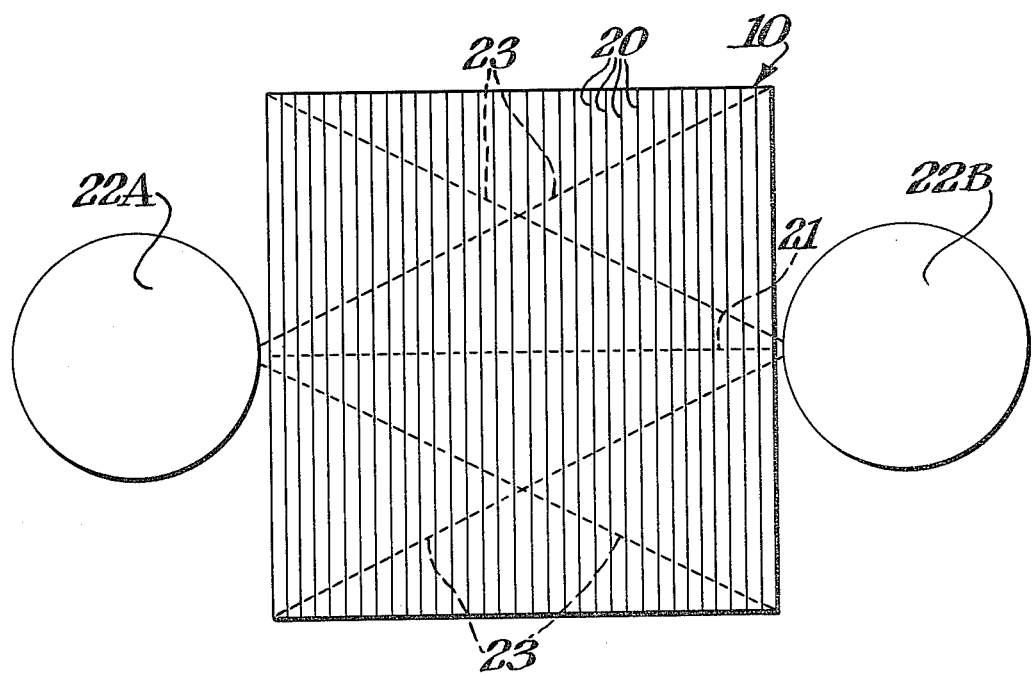
FIG. 2 is a plan view of the cell of FIG. 1 illustrating a preferred top grid contact for the cell of FIG. 1.
Figure 3:
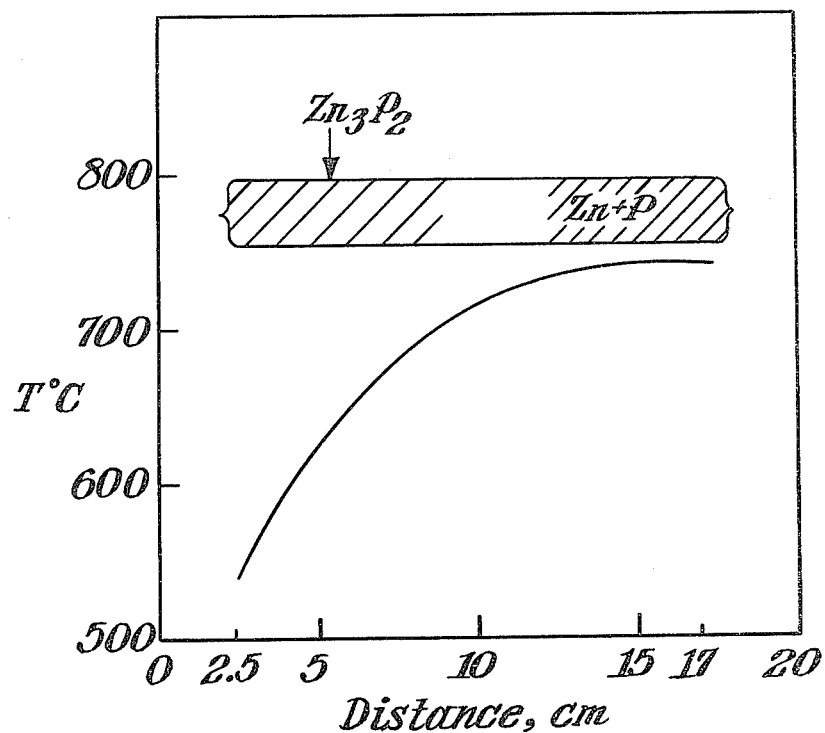
FIG. 3 is a graphical illustration showing the preferred temperature profile in a furnace used in synthesizing $Zn_3P_2$.

1. Single Crystal and Multicrystalline Zinc Phosphide Photovoltaic Cell of the Schottky Barrier Type (FIGS. 1-3)

Figure 1:
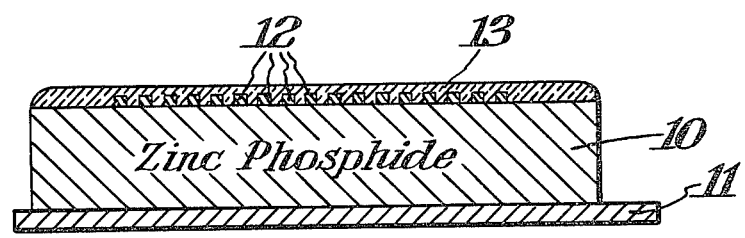
FIG. 1 is a schematic cross section of a single crystal or multicrystalline zinc phosphide photovoltaic cell in accordance with the invention in the form of a Schottky barrier cell.

Referring to the drawings, FIG. 1 is a schematic cross section of a preferred zinc phosphide photovoltaic cell in accordance with the invention in the form of a Schottky barrier cell. The device comprises, in essence, a zinc phosphide absorber 10, an ohmic electrical opaque contact 11 on one side of the absorber and a Schottky barrier metal grid 12 disposed on the other side. The grid is preferably covered with a transparent antireflection coating 13, such as glass, to minimize reflectivity from the top surface and to maximize transmission into the device.

In a preferred embodiment, the zinc phosphide absorber is a single crystal or multicrystalline slice having a thickness of approximately one-half millimeter. The ohmic contact is a 5000 angstrom layer of silver, and the grid is formed of a 2000-3000 angstrom layer of magnesium deposited on a polished surface of the zinc phosphide and photoetched to a desired grid pattern.

Alternative materials for the ohmic contact comprise gold, copper and carbon. Alternative materials for the Schottky barrier contact comprise beryllium, aluminum, nickel, titanium, manganese, tellurium, chromium, indium, tin and lead or alloys thereof, including alloys with magnesium.

The preferred Schottky barrier grid structure is illustrated in FIG. 2. The grid comprises a plurality of parallel lines 20 extending across a polished surface of the zinc phosphide in either direction from a central segment 21. The central segment, in turn, extends between a pair of circular bonding pads 22A and 22B. Diagonal cross grids 23 can be used to minimize grid resistance.

The spacing between successive parallel lines 20 should be chosen to maximize collection of minority carriers while minimally interfering with the transmission of light into the device. Accordingly, the lines should be only a few microns thick (here 2 microns) and the spacing between them should be less than about three times the minority carrier diffusion length in the zinc phosphide, i.e., less than about 12 microns. Here the preferred spacing between adjacent edges of successive lines is approximately 8 microns.

Because zinc phosphide does not occur in nature, the first step in fabricating a photovoltaic cell in accordance with the invention involves synthesizing the material. Applicants have synthesized this material by direct combination. Stoichiometric quantities of high purity zinc shot (99.9999% pure) and red phosphorous (99.999% pure) were sealed in a silica ampoule evacuated to a pressure of less than 5 microns. The ampoule was then heated slowly (10° C./hr.) to a maximum temperature of about 750° C. A temperature gradient of about 100° C. across the length of the ampoule allowed the reacted $Zn_3P_2$ to sublime to the cooler region of the tube. FIG. 3 illustrates the temperature profile of the ampoule.

The deposited material showed a large concentration of nuclei, yielding a polycrystalline "crust" on the tube wall. In addition, a substantial number of moderately sized crystals were isolated as needles (0.05×0.05×0.8 cm) and plates (0.3×0.3×0.05 cm), with a few larger crystals in additions. Complete reaction of a starting charge of 2 to 3 grams was obtained after the first firing.

Figure 4:
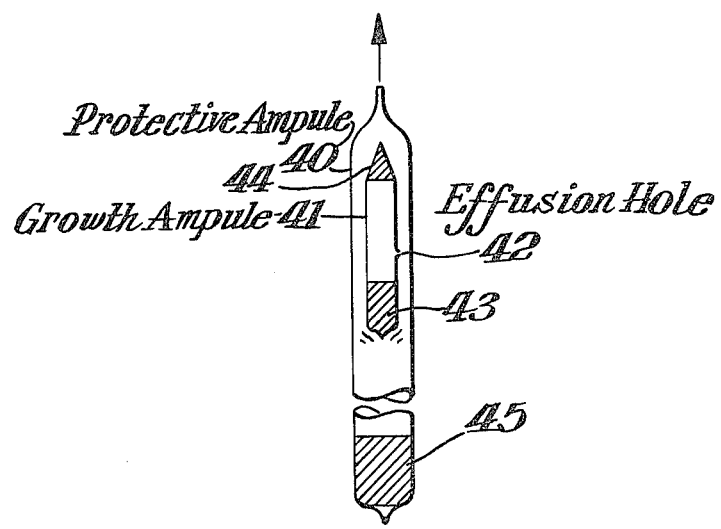
FIG. 4 illustrates an ampoule used in growing crystals of the synthesized zinc phosphide.

The next step in fabricating a cell involves forming the zinc phosphide into large crystals. FIG. 4 illustrates apparatus used to grow such crystals comprising an outer silica protective ampoule 40 enclosing an inner growth ampoule 41 provided with 10-100 microns diameter effusion aperture 42.

Single and multicrystalline boules of $Zn_3P_2$ as large as 1 cm diameter by 3 cm long have been grown in such apparatus by a vapor transport Bridgman technique. Zinc phosphide 43, synthesized as described above, is loaded into growth ampoule 41, and the growth ampoule is disposed within protective ampoule 40. The protective ampoule is then evacuated to a pressure of $10^{-4}$ to $10^{-5}$ torr. and suspended in a vertical furnace where it is subjected to a maximum temperature of 750° C.-900° C. with a gradient of up to 100° C. along the length of the protective ampoule. Vapor from the zinc phosphide source is transported to the upper portion of the growth ampoule where it forms a large crystal 44. Impure compounds pass through effusion aperture 42 and encrust the low temperature lower portion 45 of protective ampoule 40. Effusion aperture 42 assures the maximum transport rate to the growing crystal by fixing the ratio of the partial pressure of zinc to the partial pressure of phosphorous at about 1:6.

The thus-formed zinc phosphide crystal is then sliced to proper thickness and polished on one side. The silver ohmic contact is applied by vacuum evaporation on the rough side and a layer of magnesium for the Schottky grid is applied on the smooth size. The grid structure is then formed by conventional photo-etching techniques.

Devices made in this manner have been fabricated and tested as solar cells wherein they exhibit active area efficiencies as high as 7.8 percent.

2. Thin Film Zinc Phosphide Photovoltaic Cell of the Schottky Barrier Type (FIGS. 5 and 6)

Figures 5, 6:
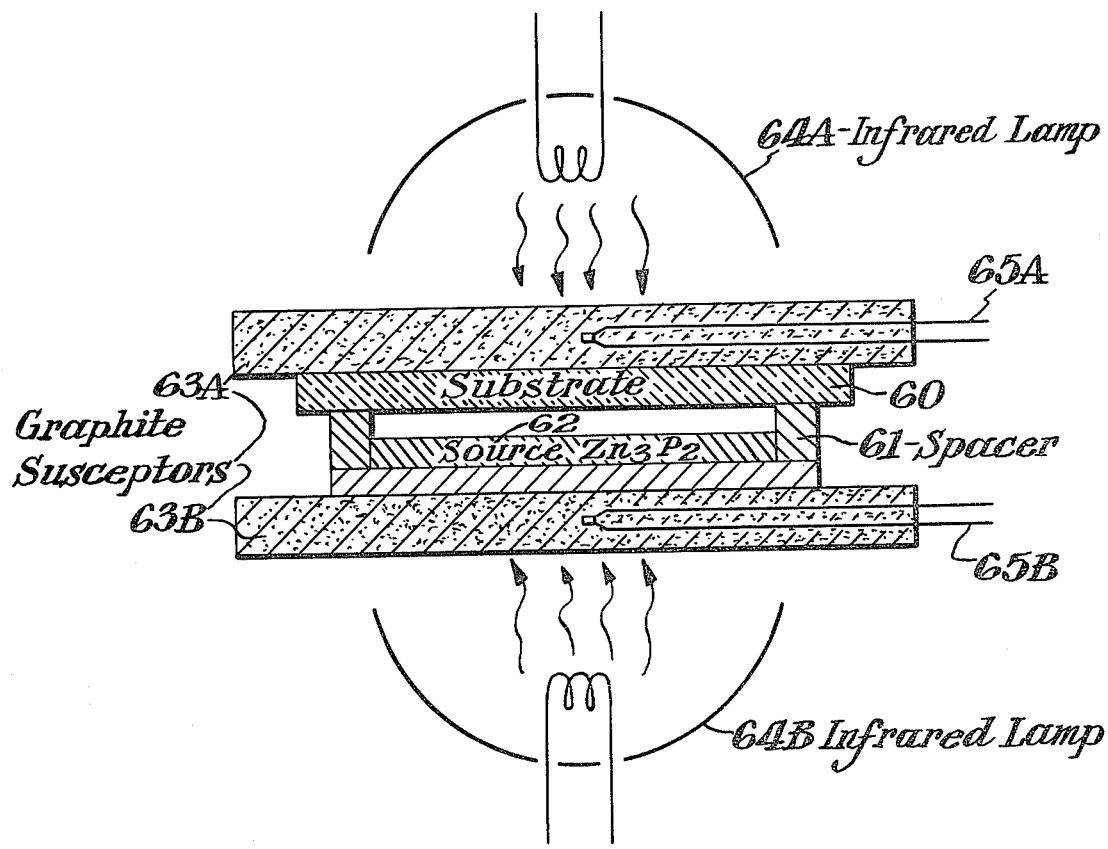
FIG. 5 is a schematic cross section of a thin film zinc phosphide photovoltaic cell of the Schottky barrier type.
FIG. 6 illustrates a close space transport apparatus useful in forming thin films of zinc phosphide.

FIG. 5 is a schematic cross section of a thin film zinc phosphide photovoltaic cell of the Schottky barrier type. This device is substantially identical to that shown in FIG. 1 except that the zinc phosphide is in the form of a thin film 50 having a thickness in the range of between 8 microns and 10 microns, and the opaque contact is a composite layer of a thin film conductive diffusion barrier 51, such as a thin film of carbon, and a second layer of highly conductive metal 52 such as silver. The device is conveniently formed on an insulating substrate 53 such as mica or other material having thermal expansion characteristics compatible with the device.

FIG. 6 illustrates a close space transport apparatus useful in forming the thin film photovoltaic cell of FIG. 5. Here a mica substrate 60 suitably coated with the ohmic contact materials is disposed on spacer 61 above a source 62 of zinc phosphide. The substrate and source are sandwiched between a pair of graphite susceptors 63A and 63B separately heated by a pair of infrared lamps 64A and 64B. Temperature can be conveniently monitored for control by thermcouples 65A and 65B embedded within the susceptors.

In operation, the arrangement of FIG. 6 is disposed within a quartz tube which is either purged with an inert gas or evacuated. The $Zn_3P_2$ is then heated to a temperature above about 400° C. causing it to vaporize congruently and deposit on the substrate as a thin film of large grain crystals having a mean diameter on the order of ten microns.

The final step in fabricating the thin film device involves forming the Schottky barrier grid in substantially the same manner as it is formed in the FIG. 1 embodiment.

3. Zinc Phosphide Photovoltaic Cell of the Heterojunction Type

Figure 7:
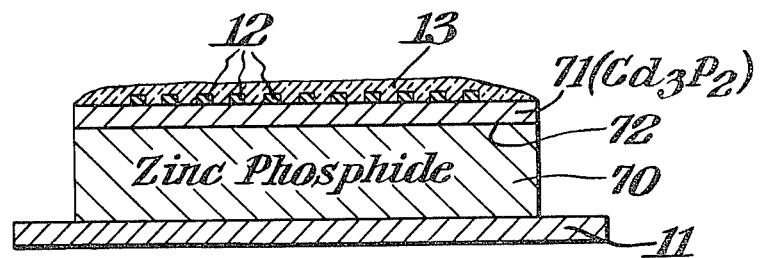
FIG. 7 is a schematic cross section of an alternative form of the invention in the form of a zinc phosphide heterojunction photovoltaic cell.

FIG. 7 illustrates another alternative embodiment of a zinc phosphide photovoltaic cell in the form of a heterojunction device comprising a layer 70 of zinc phosphide (typically containing an excess of phosphorous to make it a p-type material), and disposed in electrical contact therewith, a layer 71 of a compatible n-type material, such as cadmium phosphide ($Cd_3P_2$), defining a heterojunction 72 between the two layers.

Other compatible n-type materials include zinc telluride, zinc sulfide, zinc oxide, cadmium oxide, and indium trioxide.

The device is readily fabricated by depositing, as through vacuum evaporation, close space vapor transport or sputtering a thin layer of the n-type material on the polished surface of a zinc phosphide crystal slice. The resulting structure is then heat treated for approximately 10 minutes at 350° C. In the case of a cadmium phosphide n-type material, a solid solution forms which becomes n-type where the molar per cent of cadmium phosphide exceeds 50 per cent. The contacts are applied in the conventional manner.

The advantages of this heterojunction device, as compared to zinc phosphide Schottky barrier devices, is that the whole surface area is active and that the device has a higher built-in voltage because of the larger barrier heights at the junction.

4. Zinc Phosphide Photovoltaic Cell of the Homojunction Type (FIG. 8)

Figure 8:
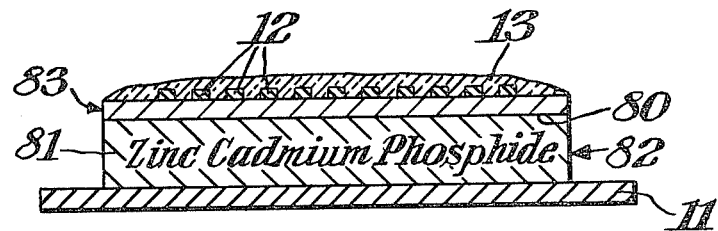
FIG. 8 is a schematic cross section of the invention in the form of a zinc cadmium phosphide homojunction photovoltaic cell.

FIG. 8 illustrates yet another alternate zinc phosphide photovoltaic cell in accordance with the invention in the form of a homojunction. Here a pn junction 80 is formed on a layer 81 of zinc cadmium phosphide such as a 50:50 mixed crystal (i.e. having the formula $(Zn_{1-x}Cd_x)_3P_2$ where $x=0.5$). The p-type region 82 is a layer which is zinc poor as compared to its cadmium content which, in the absence of sufficient zinc, contains vacancies which act as holes. The n-type region 83 is cadmium poor as compared to its zinc content. The presence of excess Zinc in such a structure produces n-type conductivity. The opaque and transparent contacts 11 and 12 can comprise the same silver and magnesium grid structures described in connection with FIG. 1.

The device can be conveniently fabricated by either altering the relative concentrations of zinc and cadmium during mixed crystal growth or by depositing a thin layer of one of the metals on the surface of a mixed crystal deficient in that metal and heat treating to effect diffusion into the surface and junction formation.

It is to be understood that throughout this specification and the appended claims that a layer comprising zinc phosphide embraces not only pure zinc phosphide but also related materials containing zinc phosphide wherein the characteristics of the zinc phosphide predominate, such as in a mixed crystalline structure of zinc cadmium phosphide.

While the invention has been described in connection with a small number of specific embodiments, it is to be understood that these are merely illustrative of the many other specific embodiments which can also utilize the principles of the invention. Thus, numerous and varied devices can be made by those skilled in the art without departing from the spirit and scope of the invention.

We claim:

1. In a photovoltaic cell of the type comprising, as successive components in the electrical path through the device, a first electrical contact means, a first semiconductor functioning as an absorber in ohmic electrical contact with said first contact means, collector in rectifying electrical contact with said absorber and forming a junction therewith, and means for electrically contacting said collector, the improvement wherein said absorber comprises zinc phosphide, said absorber comprising a thin film of polycrystalline zinc phosphide, said first contact means comprising a layer of highly conductive metal, a thin film diffusion barrier being disposed between said metal and said absorber to prevent said conductive metal from diffusing into said thin film, and said diffusion barrier being carbon.

2. In a photovoltaic cell of the type comprising, as successive components in the electrical path through the device, a first electrical contact means, a first semiconductor functioning as an absorber in ohmic electrical contact with said first contact means, a second semiconductor functioning as a collector in rectifying electrical contact with said absorber and forming a junction therewith, and means for electrically contacting said collector, the improvement wherein said absorber comprises zinc phosphide, said collector comprising an n-type material compatible with zinc phosphide forming a junction with said absorber, and said n-type material being chosen from the group consisting of cadmium phosphide, zinc telluride, zinc sulfide, zinc oxide, and cadmium oxide.

3. In a photovoltaic cell of the type comprising, as successive components in the electrical path through the device, a first electrical contact means, a first semiconductor functioning as an absorber in ohmic electrical contact with said first contact means, a second semiconductor functioning as a collector in rectifying electrical contact with said absorber and forming a junction therewith, and means for electrically contacting said collector, the improvement wherein said absorber comprises zinc phosphide, said collector being an n-type material comprising a solid solution containing cadmium phosphide in excess of 50 percent.

4. In a photovoltaic cell of the type comprising, as successive components in the electrical path through the device, a first electrical contact means, a first semiconductor in ohmic electrical contact with said first contact means, a second semiconductor in rectifying electrical contact with said first semiconductor and forming a junction therewith, and means for electrically contacting said second semiconductor, the improvement wherein said first semiconductor comprises zinc cadmium phosphide which is zinc rich, and said second semiconductor being a region of zinc cadmium phosphide of opposite conductivity and which is zinc poor forming said junction with said first semiconductor.

* * * * *